(12) United States Patent
Gunawan et al.

(10) Patent No.: US 10,557,897 B2
(45) Date of Patent: Feb. 11, 2020

(54) NON-CONTACT CONDUCTIVITY AND MAGNETIC SUSCEPTIBILITY MEASUREMENT WITH PARALLEL DIPOLE LINE TRAP SYSTEM

(71) Applicant: International Business Machines Corporation, Armonk, NY (US)

(72) Inventors: Oki Gunawan, Westwood, NJ (US); Hendrik F. Hamann, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 15/875,490

(22) Filed: Jan. 19, 2018

(65) Prior Publication Data

US 2019/0227131 A1    Jul. 25, 2019

(51) Int. Cl.
    *G01R 33/16*      (2006.01)
    *G01R 33/00*      (2006.01)
    *G01B 11/14*      (2006.01)

(52) U.S. Cl.
    CPC .............. *G01R 33/16* (2013.01); *G01B 11/14* (2013.01); *G01R 33/0005* (2013.01)

(58) Field of Classification Search
    CPC ..... G01R 33/16; G01R 33/0005; G01B 11/14
    USPC ....................................... 324/201; 250/396 R
    See application file for complete search history.

(56) References Cited

U.S. PATENT DOCUMENTS

| | | | |
|---|---|---|---|
| 6,819,120 B2 | 11/2004 | Tam | |
| 6,879,167 B2 | 4/2005 | Ju et al. | |
| 7,701,205 B2 | 4/2010 | Linder | |
| 8,895,355 B2 | 11/2014 | Cao et al. | |
| 8,907,690 B2 | 12/2014 | Petersen et al. | |
| 9,000,774 B2 | 4/2015 | Gunawan | |
| 9,093,377 B2 | 7/2015 | Cao et al. | |
| 9,103,652 B2 | 8/2015 | Gunawan | |
| 9,103,653 B2 | 8/2015 | Gunawan | |
| 9,176,175 B2 | 11/2015 | Gunawan | |
| 9,236,293 B2 | 1/2016 | Cao et al. | |
| 2014/0266248 A1 | 9/2014 | Gunawan | |
| 2017/0045433 A1 | 2/2017 | Gunawan et al. | |
| 2017/0299410 A1 | 10/2017 | Gunawan | |
| 2017/0301445 A1 | 10/2017 | Gunawan | |

FOREIGN PATENT DOCUMENTS

CN          105486924 A      4/2016

OTHER PUBLICATIONS

Gunawan et al., "A parallel dipole line system," Applied Physics Letters 106, pp. 062407-1-5 (Feb. 2015).
English Translation of CN105486924A by Guo Liang et. al. Apr. 13, 2016 (9 pages).

*Primary Examiner* — Melissa J Koval
*Assistant Examiner* — Courtney G McDonnough
(74) *Attorney, Agent, or Firm* — Vazken Alexanian; Michael J. Chang, LLC

(57) ABSTRACT

A non-contact conductivity and magnetic susceptibility meter using a magnetic parallel dipole line (PDL) trap system is provided. In one aspect, a measurement system includes: a PDL trap having a pair of dipole line magnets; and a diamagnetic object levitating above the dipole line magnets, wherein the diamagnetic object is configured to contain a material under test for conductivity and magnetic susceptibility measurement using the measurement system. A method for analyzing a material under test using the present PDL trap-based non-contact measurement system is also provided.

20 Claims, 10 Drawing Sheets

NON-CONTACT CONDUCTIVITY AND MAGNETIC SUSCEPTIBILITY MEASUREMENT WITH PARALLEL DIPOLE LINE TRAP SYSTEM

FIELD OF THE INVENTION

The present invention relates to magnetic parallel dipole line (PDL) trap systems, and more particularly, to a non-contact conductivity and magnetic susceptibility meter using a magnetic PDL trap system.

BACKGROUND OF THE INVENTION

Non-contact conductivity measurement is often needed for electronics materials such as metals, semiconductors, or organic conducting materials that are inaccessible by electrical contacts due to their small size, surface insulation and/or the unavailability of ohmic contacts. Similarly, non-contact magnetic susceptibility measurements are also often needed for various solid state materials. This situation often arises in semiconductor or material physics research. Magnetic susceptibility is the degree of magnetization of a material in response to an applied magnetic field.

Therefore, techniques for accurate and efficient non-contact conductivity and magnetic susceptibility measurements would be desirable.

SUMMARY OF THE INVENTION

The present invention provides a non-contact conductivity and magnetic susceptibility meter using a magnetic parallel dipole line (PDL) trap system. In one aspect of the invention, a measurement system is provided. The measurement system includes: a PDL trap having a pair of dipole line magnets; and a diamagnetic object levitating above the dipole line magnets, wherein the diamagnetic object is configured to contain a material under test for conductivity and magnetic susceptibility measurement by the measurement system.

In another aspect of the invention, a method for analyzing a material under test is provided. The method includes the steps of: providing a measurement system including i) a PDL trap having a pair of dipole line magnets, and ii) a diamagnetic object levitating above the dipole line magnets, wherein the diamagnetic object is configured to contain the material under test; displacing the diamagnetic object to initiate oscillations of the diamagnetic object in the PDL trap; detecting oscillations of the diamagnetic object in the PDL trap; determining a damping time constant τ from the oscillations of the diamagnetic object in the PDL trap; and determining a conductivity of the material under test using the damping time constant τ. Further, a frequency f can be determined from the oscillations of the diamagnetic object in the PDL trap, and a magnetic susceptibility of the material under test can be determined using the frequency f.

A more complete understanding of the present invention, as well as further features and advantages of the present invention, will be obtained by reference to the following detailed description and drawings.

DETAILED DESCRIPTION OF PREFERRED EMBODIMENTS

Provided herein is a non-contact conductivity and magnetic susceptibility meter with a parallel dipole line (PDL) trap system. The PDL system includes a pair of transverse cylindrical magnets. A diamagnetic object such as a graphite slab (for instance coated with, or otherwise configured to contain, an arbitrary (e.g., diamagnetic or non-diamagnetic) material under test—see below) is trapped at the center of the PDL trap. The diamagnetic object is confined in a weak one-dimensional camelback magnetic potential along the longitudinal axis of the trap that provides stable trapping. See, for example, Gunawan et al., "A parallel dipole line system," Applied Physics Letters 106, pp. 062407-1-5 (February 2015) (hereinafter "Gunawan 2015"); and U.S. Pat. Nos. 8,895,355, 9,093,377, and 9,236,293 all issued to Cao et al., entitled "Magnetic Trap for Cylindrical Diamagnetic Materials," the contents of each of which are incorporated by reference as if fully set forth herein.

At rest, the diamagnetic object levitates above the magnets at the center of the PDL trap. Due to the camelback magnetic potential, the diamagnetic object will oscillate back and forth over the magnets when the object is displaced in the trap. According to an exemplary embodiment, the diamagnetic object is displaced using an electrode above the object and a bias voltage applied to the electrode and the PDL magnets—see below.

The damping time constant of the underdamped oscillation of the diamagnetic object in the PDL trap can be extracted. When viscous air drag is eliminated by performing the experiment in vacuum, the damping still occurs due to magnetic braking effect of the object in a slightly non-uniform field that has a camelback field profile along the longitudinal (z) axis. The conductivity of the diamagnetic object can be determined based on the damping time constant. Advantageously, conductivity measurements can be obtained via the present system without the need to contact the diamagnetic object (and/or the material of interest if coated on, or contained in, the diamagnetic object). Similarly, the magnetic susceptibility ($\chi$) of the material can also be determined from the frequency of the oscillation.

Figure 1:
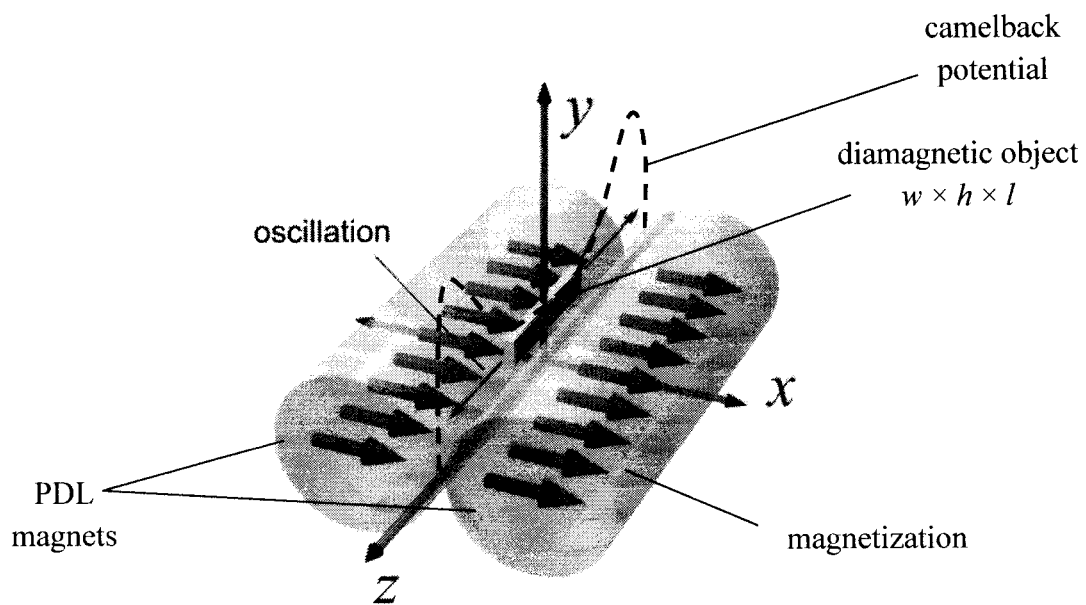
FIG. 1 is a diagram illustrating a parallel dipole line (PDL) trap system having a trapped diamagnetic object according to an embodiment of the present invention.
Figure 2:
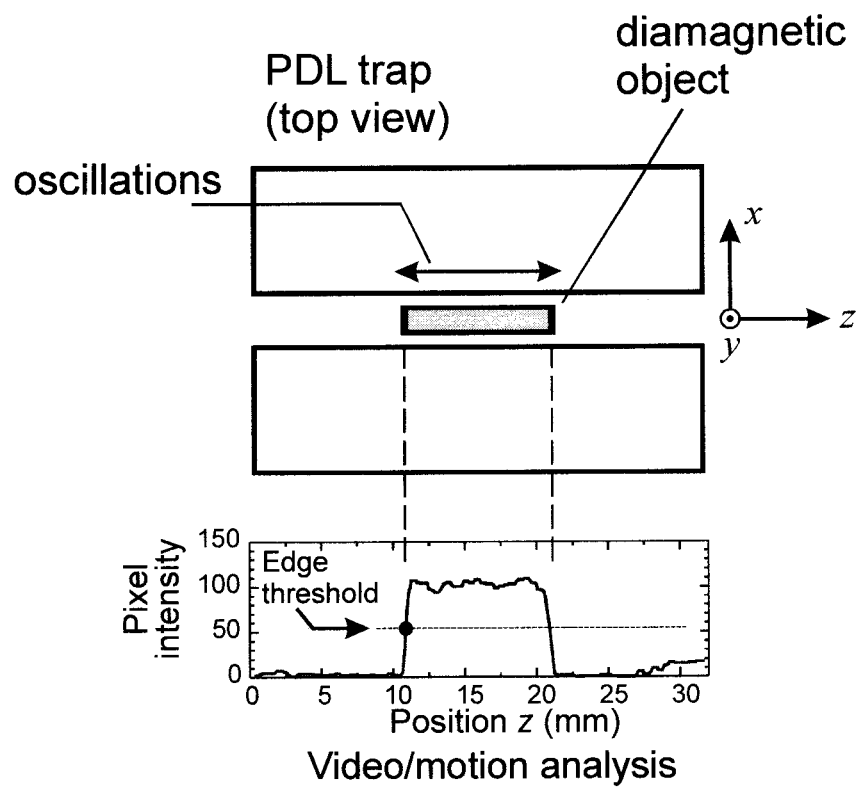
FIG. 2 is a diagram illustrating a top-down view of the PDL trap of FIG. 1 according to an embodiment of the present invention.

The principles of operation of the present system are now described by way of reference to FIGS. 1 and 2. As shown in FIG. 1, the PDL trap includes the above-described pair of transverse cylindrical magnets (PDL magnets) and a diamagnetic object (in this case a graphite slab having a length l, a width w, and a height h) trapped at the center of the PDL trap. Arrows are used to indicate the orientation of the magnetization of the PDL magnets.

As will be described in detail below, the diamagnetic object can itself be the material under test, or the material can be coated on or contained within the diamagnetic object. For instance, the material under test (i.e., the material for which conductivity and magnetic susceptibility measurements are being made) can be coated onto (or otherwise attached) to the diamagnetic object. Alternatively, the diamagnetic object can be configured as a 'capsule boat' (or other vessel or container) into which the material under test is placed. In either case, the effect of the presence of the diamagnetic object in addition to the material under test must be taken into account.

With excitation, the diamagnetic object in the PDL trap can perform oscillations. See FIG. 1. These oscillations occur along the longitudinal axis (i.e., the z-axis in FIG. 1). FIG. 2 provides a top down schematic view of the PDL trap of FIG. 1. The depiction in FIG. 2 aligns horizontally with the z-axis such that the oscillations of the diamagnetic object are from left to right and vice versa. FIG. 2 also illustrates how video motion analysis can be used to monitor the position of the diamagnetic object in the PDL trap. Namely, a digital video camera (not shown) can be positioned over the PDL trap to capture images of the diamagnetic object. The pixels in a digital video camera collect photons which are converted into an electrical charge that represents intensity. The video data can be analyzed to determine the position $z_R$ of the diamagnetic object based on pixel intensity in the video images. A certain pixel intensity value can be chosen that marks the edge of the diamagnetic object, i.e., an edge threshold. See, for example, U.S. patent application Ser. No. 14/826,934 by Gunawan et al., entitled "Parallel Dipole Line Trap Viscometer and Pressure Gauge" (hereinafter "U.S. patent application Ser. No. 14/826,934"), the contents of which are incorporated by reference as if fully set forth herein.

As described in U.S. patent application Ser. No. 14/826,934, by capturing digital video of the trapped diamagnetic object, one can obtain the damped oscillation curve of the rod and from that extract its parameters such as the oscillation frequency (f) and the damping time constant ($\tau$). See, for example, FIG. 2c of U.S. patent application Ser. No. 14/826,934, wherein t is time, l is length of the diamagnetic object, and $z_R$ is the rod position.

The movement of the diamagnetic object in the presence of the magnetic field with a camelback profile at the center plane induces eddy currents that cause a magnetic braking effect. A magnetic braking effect involves movement of a conductor (in this case the diamagnetic object) in close proximity to a stationary magnet (in this case the PDL magnets) which induces eddy currents in the conductor based on Faraday or electromagnetic induction. The magnetic field generated by the eddy currents opposes the magnetic field of the magnet thereby generating a drag force on the moving conductor, i.e., the magnetic braking effect.

Assuming that the air viscous drag is negligible (e.g., measurement is made in a vacuum), the oscillation is underdamped due to the magnetic viscous drag force F, which for a rectangular slab is:

$$F = -k_D v = c_0 \sigma \beta^2 l^5 w h v, \quad (1)$$

wherein $k_D$ is the magnetic force drag coefficient, v is object velocity, $c_0$ is a constant, $\sigma$ is the conductivity, l, w and h are the length, width and height of the slab, respectively, and $\beta$ is the quadratic coefficient of the camelback magnetic field profile given as:

$$\beta = \frac{1}{2} \partial^2 B_x(z)/\partial z^2. \quad (2)$$

The damping time constant of the oscillation $\tau$ is given as:

$$\tau = 2m/k_D = 2\rho/c_0 \sigma \beta^2 l^4, \quad (3)$$

wherein m is the mass, and $\rho$ is the mass density. Therefore, the conductivity $\sigma$ of the object can be calculated from the damping time constant $\tau$ as:

$$\sigma = 2\rho/c_0 \tau \beta^2 l^4. \quad (4)$$

It is notable that this analysis can also be generalized to a diamagnetic object that is a cylindrical (e.g., graphite) rod, not only a slab. In case of a mixture of two materials: (1) the diamagnetic boat with a known conductivity $\sigma_1$ and volume $V_1$, and (2) the material-under-test with volume $V_2$, the unknown conductivity $\sigma_2$ of the material under test can be calculated as:

$$\sigma_2 = \frac{\sigma(V_1 + V_2) - \sigma_1 V_1}{V_2}. \quad (5)$$

From the frequency of the oscillation, one can then calculate the magnetic susceptibility $\chi$ of the object which is given as (Gunawan 2015):

$$\chi = -\frac{2}{1 + \frac{\mu_0 M^2 f_{Z2}(y_0, L, R)}{4\pi^2 \rho L^2 f^2}}, \quad (6)$$

wherein M is the magnetization of the magnet, L and R are the length and radius of the cylindrical magnet and f is the frequency of the oscillation. $f_{Z2}$ is the camelback potential trap strength coefficient which is given in Gunawan 2015.

Similarly, for a mixture of two materials: (1) the diamagnetic boat with a known susceptibility $\chi_1$ and volume $V_1$, and (2) the material under test with volume $V_2$, the unknown conductivity $\chi^2$ of the material under test can be calculated as:

$$\chi_2 = \frac{\chi(V_1 + V_2) - \chi_1 V_1}{V_2}. \quad (7)$$

Figure 3:
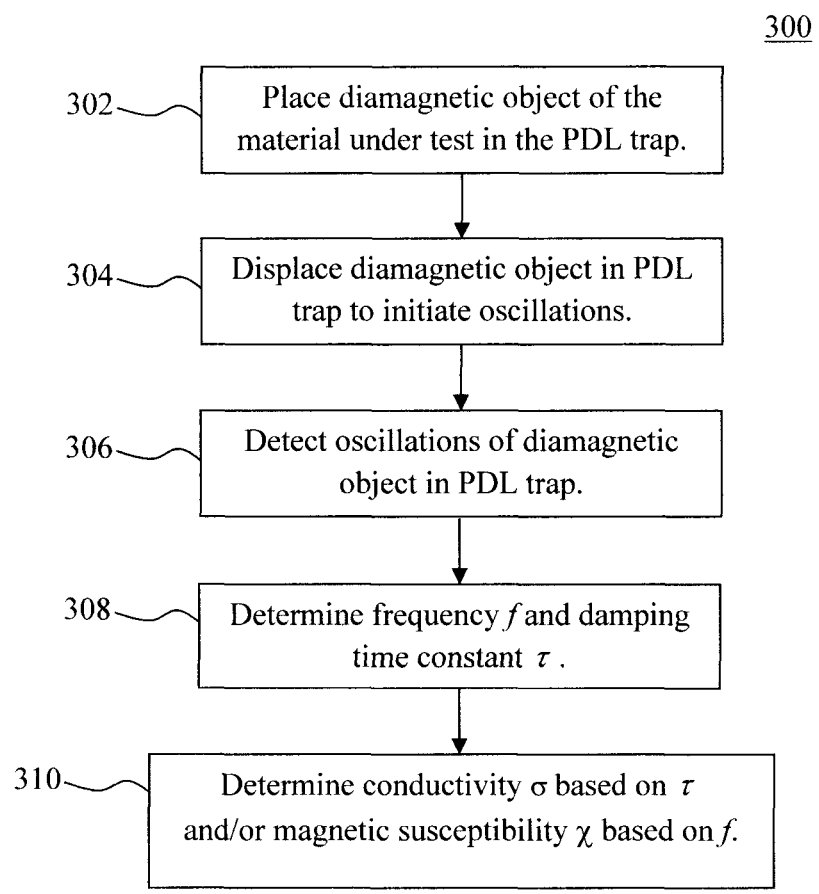
FIG. 3 is a diagram illustrating an exemplary methodology for measuring conductivity and magnetic susceptibility of a diamagnetic material according to an embodiment of the present invention.

Given the above description of the principles of operation, an exemplary process for measuring conductivity and magnetic susceptibility of a material using the present system is now described by way of reference to methodology 300 of FIG. 3. In step 302, a diamagnetic object is placed in the above-described PDL trap system contained in a vacuum chamber. It is assumed in this example that the diamagnetic object is a (e.g., rectangular) slab of the material under test. In that case, the material under test is itself diamagnetic and the sample being employed is large enough to form into the slab. Materials such as graphite, bismuth, and metals like copper, gold, etc. are diamagnetic. An alternative embodiment will be provided below which deals with the situation where the material under test is not diamagnetic.

In step 304, the diamagnetic object is displaced in the PDL trap to initiate oscillations. As will be described in detail below, electrodes over the PDL trap can be employed to displace the diamagnetic object, commencing oscillations.

In step 306, the movement of the diamagnetic object in the PDL trap is detected. As described above, electrodes over the PDL trap can be used to initiate oscillations. These electrodes can also be used to detect the position of the diamagnetic object in the PDL trap. See below. Other means for monitoring movement of the diamagnetic object in the PDL trap are also contemplated herein, such as digital video monitoring, light source and photodetector monitoring, etc.

In step 308, the frequency f and the damping time constant $\tau$ are determined (as described above) from the movement of the diamagnetic object in the PDL trap. Further, as provided above, the measurements are conducted in vacuum (e.g., in a vacuum chamber) making the air viscous drag negligible. Further, as will be described in detail below, the accuracy of the frequency and damping time constant measurements can be improved using an auto oscillator circuit. Finally, in step 310 the damping time constant $\tau$ is used to determine the conductivity of the diamagnetic object/material under test and/or the frequency f is used to determine the magnetic susceptibility.

Figure 4:
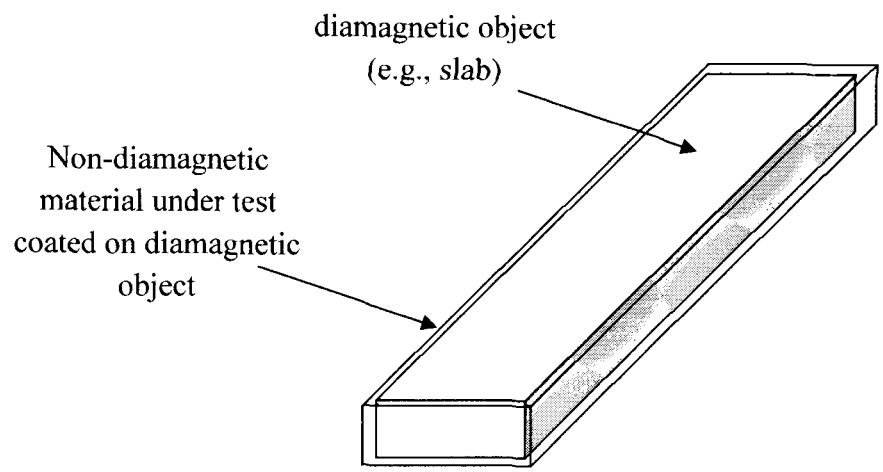
FIG. 4 is an enlarged view of the diamagnetic object coated with a non-diamagnetic material under test according to an embodiment of the present invention.
Figure 5:
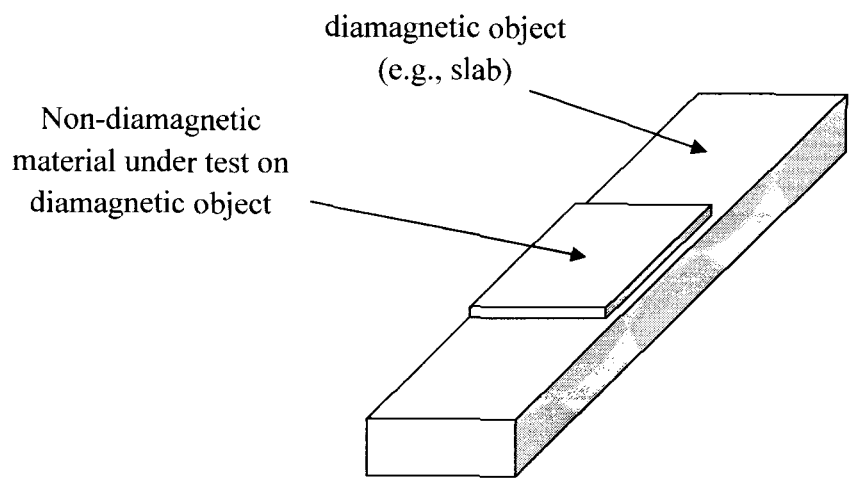
FIG. 5 is an enlarged view of the diamagnetic object having a layer of the material under test on a side(s) thereof according to an embodiment of the present invention.
Figure 6:
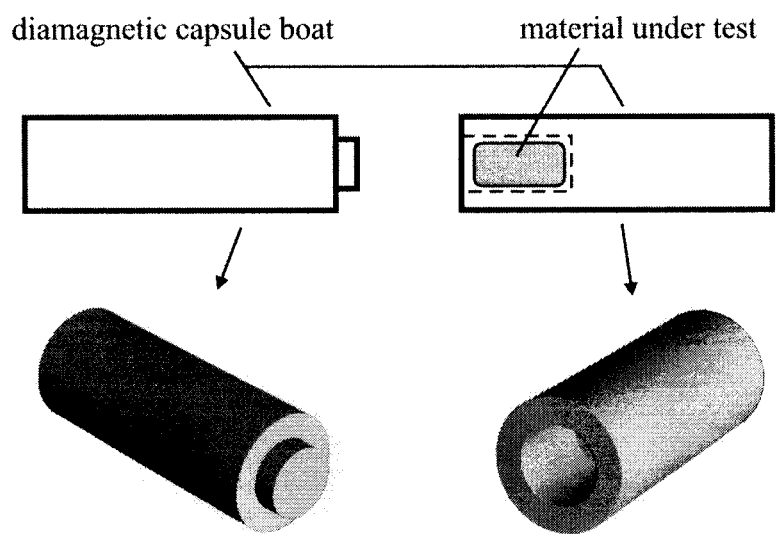
FIG. 6 is an enlarged view of the diamagnetic object configured as a 'capsule boat' into which a material under test is placed according to an embodiment of the present invention.

The present PDL trap-based system is however not limited to conductivity and magnetic susceptibility measurements of only a single diamagnetic material. For instance, another material under test can be coated on a diamagnetic slab. See, for example, FIG. 4. The material under test can be anything, as long as the diamagnetic slab, capsule boat, etc. still floats. In the enlarged view of the diamagnetic object (in this case rectangular slab) shown in FIG. 4, the material under test is uniformly coated on the surface of the diamagnetic object. A uniform coating of the material is however not required, and the material under test can instead be formed on any surface/side(s) of the slab. See enlarged view in FIG. 5. Alternatively, the diamagnetic object can be configured as a 'capsule boat' or any other similar type of vessel in which the material of interest can be placed. See enlarged view of the diamagnetic object configured as a 'capsule boat'. Namely, in the example shown in FIG. 6, the diamagnetic object/boat has a hollowed out center portion in which a sample can be placed.

The same basic procedure applies to testing the material under test using the present PDL trap-based system, except that one must now take into account the effects of the diamagnetic object in addition to the material under test. See, for example, methodology 700 of FIG. 7. By way of example only, one can account for the diamagnetic object by first taking a conductivity and magnetic susceptibility reading with just the diamagnetic object (and no material under test) in order to 'zero-out' the system. This initial calibration step need only be carried out once before readings are taken, and anytime re-calibration of the system is needed (e.g., when a new diamagnetic 'boat' is being used).

Figure 7:
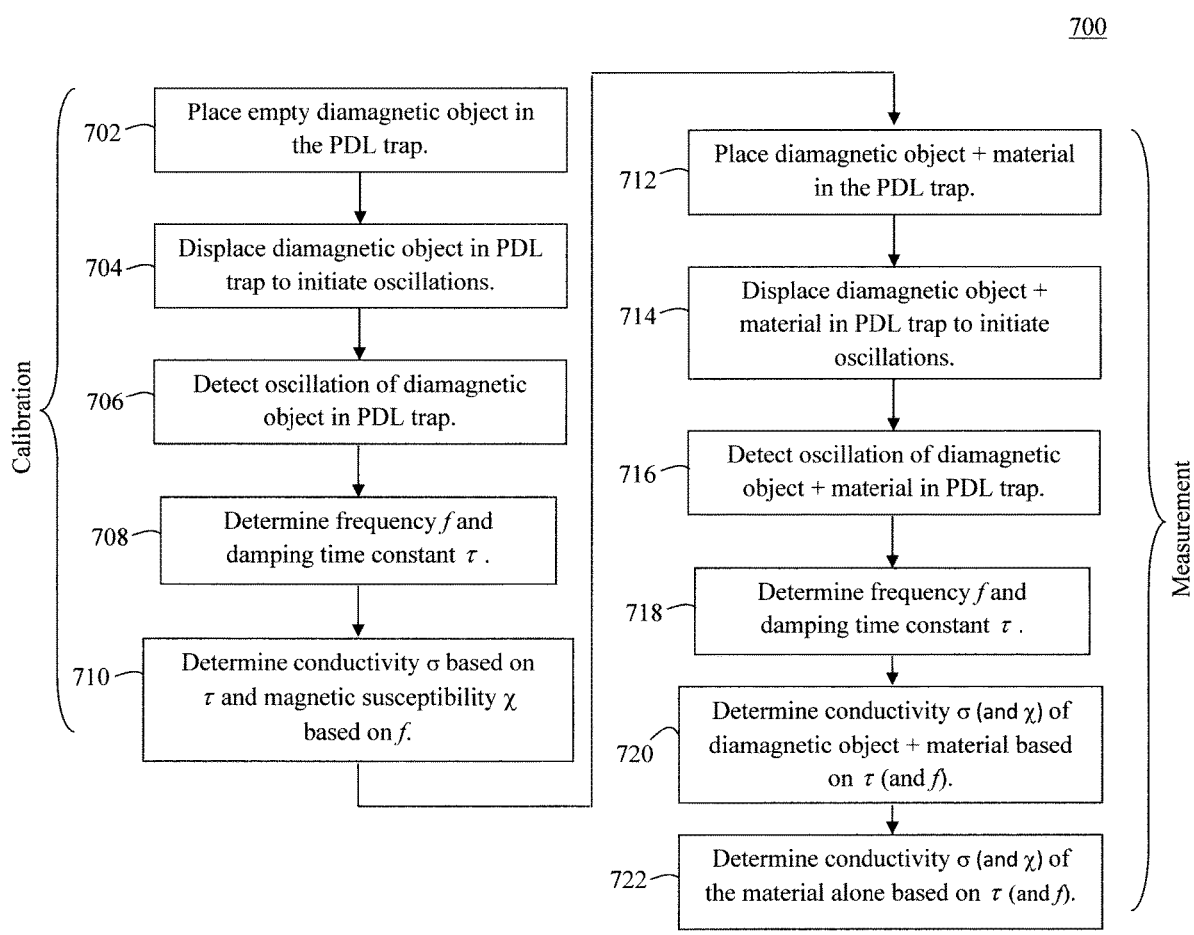
FIG. 7 is a diagram illustrating an exemplary methodology for measuring conductivity and magnetic susceptibility of a non-diamagnetic material according to an embodiment of the present invention.

Thus, according to an exemplary embodiment, in the same manner as described above, the diamagnetic object is placed in the PDL trap empty (step 702), the diamagnetic object is displaced to initiate oscillations (step 704), the movement of the empty object in the PDL trap is detected (step 706), the frequency f and the damping time constant $\tau$ are determined (as described above) from the movement of the empty object in the PDL trap (step 708), and the conductivity and magnetic susceptibility of the (empty) diamagnetic object is determined (step 710). As shown in FIG. 7, steps 702-710 make up a calibration phase of the process which serves to determine the conductivity and magnetic susceptibility of the diamagnetic object alone.

Next, as per the measurement phase, in step 712 the diamagnetic object plus the material under test is placed in the PDL trap. As described above, the material can be coated on the diamagnetic object, or placed into the diamagnetic object which has been fashioned as a 'boat', etc. The measurement process is then repeated, this time with the diamagnetic object plus the material under test. Specifically, the diamagnetic object plus material is displaced to initiate oscillations (step 714), the movement of the diamagnetic object plus material in the PDL trap is detected (step 716), the frequency f and the damping time constant $\tau$ of the diamagnetic object plus material is measured (step 718), and the conductivity and magnetic susceptibility of the diamagnetic object plus the material under test is determined (step 720).

Then the conductivity and/or the magnetic susceptibility of the material under test alone is determined using Equations 5 and 7, respectively. See step 722.

Figure 8:
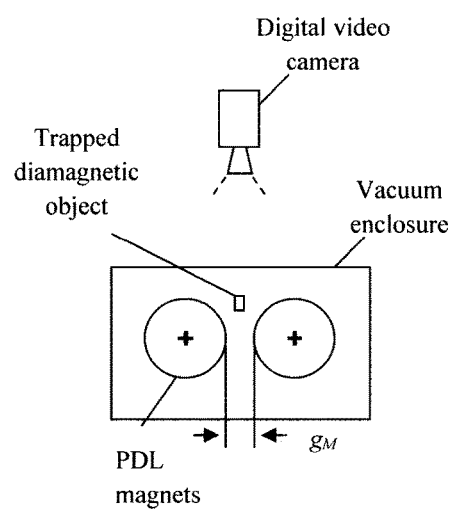
FIG. 8 is a front-view diagram illustrating an exemplary configuration of the present PDL trap-based conductivity and magnetic susceptibility measurement system using a digital video camera to detect oscillations of the trapped diamagnetic object according to an embodiment of the present invention.

Given the above-description, some exemplary configurations of the present PDL trap-based conductivity measurement system are now provided. One exemplary embodiment of the present PDL trap-based conductivity and magnetic susceptibility measurement system is shown in FIG. 8 (front view) and FIG. 9 (side view). In this example, a digital video camera is used to detect movement of the diamagnetic object in the PDL trap. As provided above, the diamagnetic object can itself be the material under test, or the material can be coated on or contained within the diamagnetic object (e.g., that is configured as a 'capsule boat' or other vessel in which the material under test is placed). Referring first to FIG. 8, the present conductivity and magnetic susceptibility measurement system includes a pair of transverse cylindrical magnets (labeled "PDL magnets") and a trapped object (such as a diamagnetic slab) levitating above the PDL magnets. As described above, the diamagnetic object can be formed of the material under test or alternatively, when the material under test is not itself diamagnetic, another diamagnetic material such as graphite to which the material under test can be attached or placed (e.g., a (graphite) capsule boat), etc.

In the exemplary configuration shown in FIG. 8, the PDL magnets are separated by a gap $g_M$. Having a gap $g_M$ between the PDL magnets has some noted benefits, such as enabling line of sight between, e.g., a light source and photodetectors above and below the PDL magnets respectively and to enlarge the space in between the magnets to allow for a larger object. See below. Varying the gap $g_M$ can also be used to control a height at which the diamagnetic object levitates above the PDL magnets. See, for example, U.S. patent application Ser. No. 15/131,566 by Oki Gunawan, entitled "Parallel Dipole Line Trap with Variable Gap and Tunable Trap Potential" (hereinafter "U.S. patent application Ser. No. 15/131,566") the contents of which are incorporated by reference as if fully set forth herein.

Having a gap $g_M$ between the magnets is however not a requirement, and embodiments are anticipated herein where the PDL magnets contact one another. Namely, the PDL magnets are naturally drawn towards one another, and means must be employed to move the magnets apart from one another (by the distance $g_M$). For instance, (fixed size) spacers or a variable gap fixture mount (not shown) can be employed. See, for example, U.S. patent application Ser. No. 15/131,566.

Figure 9:
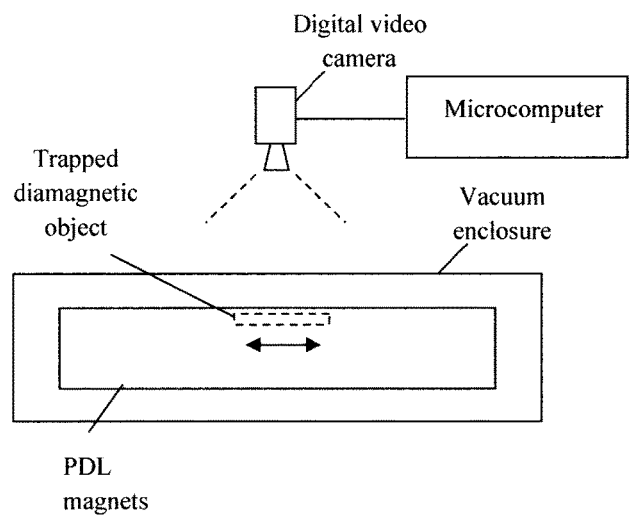
FIG. 9 is a side-view diagram of the present PDL trap-based conductivity and magnetic susceptibility measurement system using a digital video camera to detect the oscillations of the trapped diamagnetic object according to an embodiment of the present invention.

As shown in FIG. 8 and FIG. 9, the digital video camera is positioned over the PDL magnets and, during operation, captures images of the diamagnetic object oscillating in the PDL trap. The pixels in a digital video camera collect photons which are converted into an electrical charge that represents intensity. The data from the digital video camera can be collected and analyzed using a microcomputer. An apparatus that can be configured to serve as the microcomputer is described in conjunction with the description of FIG. 16, below. The position of the diamagnetic object in the PDL trap can be determined based on pixel intensity in the video images, wherein a certain pixel intensity value can be chosen that marks the edge of the diamagnetic object, i.e., an edge threshold. See, for example, U.S. patent application Ser. No. 14/826,934.

As will be described in detail below, means for initiating oscillations of the diamagnetic object in the PDL trap are needed. By way of example only, this could simply involve an actuator (not shown) configured to momentarily lift one end of the PDL trap to start the diamagnetic rod oscillating. See, for example, U.S. patent application Ser. No. 14/826, 934 by Gunawan et al., entitled "Parallel Dipole Line Trap Viscometer and Pressure Gauge," the contents of which are incorporated by reference as if fully set forth herein. Alternatively, an electrode(s) placed over the trap can be used to initiate (as well as to monitor) movement of the diamagnetic object in the trap. See below.

Figure 10:
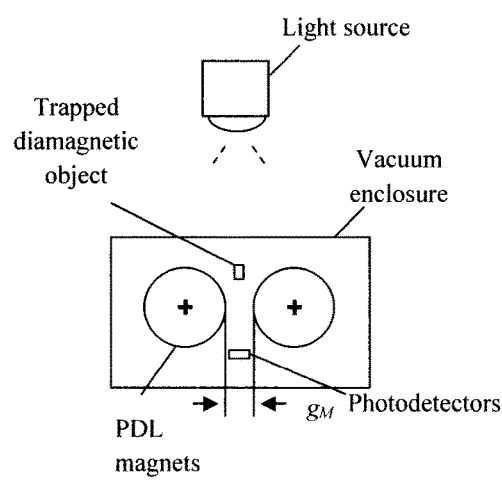
FIG. 10 is a front-view diagram illustrating an exemplary configuration of the present PDL trap-based conductivity and magnetic susceptibility measurement system using a light source and photodetectors to detect oscillations of the trapped diamagnetic object according to an embodiment of the present invention.
Figure 11:
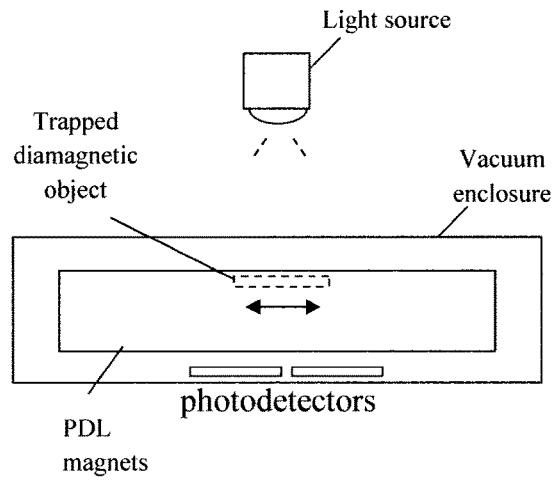
FIG. 11 is a side-view diagram of the present PDL trap-based conductivity and magnetic susceptibility measurement system using a light source and photodetectors to detect oscillations of the trapped diamagnetic object according to an embodiment of the present invention.

In another exemplary embodiment, a light source and photodetectors are used to detect movement of the diamagnetic object in the PDL trap. See FIG. 10 (front view) and FIG. 11 (side view). As provided above, the diamagnetic object can itself be the material under test, or the material can be coated on or contained within the diamagnetic object (e.g., that is configured as a 'boat' or other vessel in which the material under test is placed). As shown in FIG. 10 and FIG. 11, a light source and photodetectors are present above and below the PDL trap, respectively. By way of example only, suitable light sources include, but are not limited to, an incandescent light bulb, a light emitting diode and/or a laser, and suitable photodetectors include, but are not limited to, a semiconductor photodetector and/or a light-dependent-resistor (LDR). According to an exemplary embodiment, the photodetectors are differential photodetectors which provide a differential light signal to obtain accurate displacement readings by taking the differential light signal and rejecting the background ambient noise signal.

The light source and corresponding photodetectors can be used to determine the position of the object in the trap. For instance, as the trapped diamagnetic object moves within the trap it passes between the light source and the photodetectors. For illustrative purposes only, two photodetectors are shown. See FIG. 11. However, in practice, more (or fewer) photodetectors can be employed as needed. Detecting movement of the trapped diamagnetic object using the light source and photodetectors is accomplished as follows. When the trapped diamagnetic object moves to the left side of the trap it will block light from the light source from reaching the photodetector on the left (with light from the light source reaching the photodetector on the right). Conversely, when the trapped diamagnetic object moves to the right side of the trap it will block light from the light source from reaching the photodetector on the right (with light from the light source reaching the photodetector on the left).

In yet another exemplary embodiment, electrodes placed above the PDL trap are used to displace the trapped diamagnetic object (e.g., to commence oscillations of the diamagnetic object in the trap) and/or to detect the position of the diamagnetic object in the trap. See FIG. 12 (front view) and FIG. 13 (cross-section view). As provided above, the diamagnetic object can itself be the material under test, or the material can be coated on or contained within the diamagnetic object (e.g., that is configured as a 'capsule boat' or other vessel in which the material under test is placed). In this particular example, the electrodes are used both to control the position of the diamagnetic object in the trap and to sense the position of the diamagnetic object in the trap. Thus, the electrodes are labeled "control & sense electrodes" in FIGS. 12 and 13. However, embodiments are anticipated herein where the electrodes are leveraged to perform these functions individually, such as to actuate the diamagnetic object in conjunction with the above-described digital video camera or light source/photodetector to detect its position.

Figure 12:
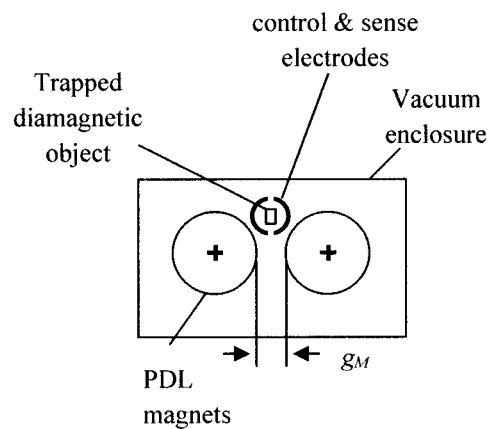
FIG. 12 is a front-view diagram of the present PDL trap-based conductivity and magnetic susceptibility measurement system using electrodes with drive and sense circuitry according to an embodiment of the present invention.
Figure 13:
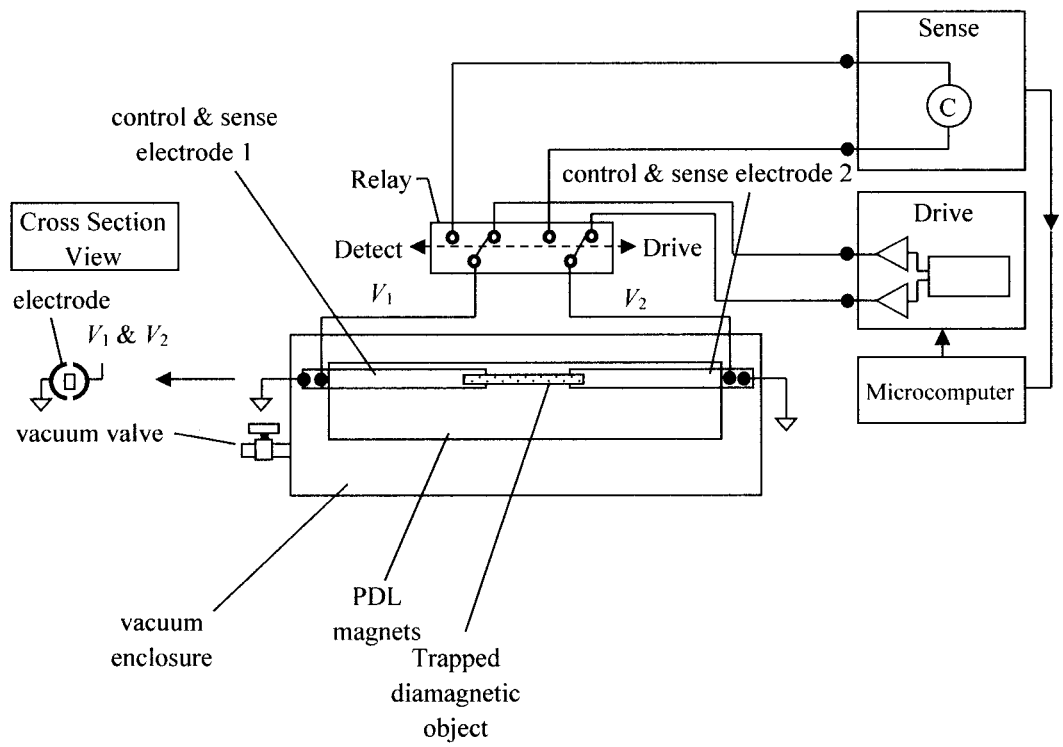
FIG. 13 is a side-view diagram of the present PDL trap-based conductivity and magnetic susceptibility measurement system using the electrodes with drive and sense circuitry according to an embodiment of the present invention.

In the example depicted in FIGS. 12 and 13, the electrodes are cylindrical case electrodes that at least partially surround the trapped diamagnetic object. Cylindrical case electrodes are also described in U.S. patent application Ser. No. 15/131, 443 by Oki Gunawan, entitled "Voltage-Tunable 1D Electro-Magnet Potential and Probe System with Parallel Dipole Line Trap" (hereinafter "U.S. patent application Ser. No. 15/131,443"), the contents of which are incorporated by reference as if fully set forth herein. As shown in FIG. 12 for instance, the cylindrical case electrode includes two semicircular halves or shells in a non-contact position relative to one another and which partially surround the trapped diamagnetic object. Further, in this particular example, a pair of the cylindrical case electrodes is present at each end of the PDL trap, i.e., control & sense electrode 1 and control & sense electrode 2, respectively. See FIG. 13. It is notable that while the cylindrical case electrode design advantageously enhances the capacitance and thus lowers the voltage requirement, other electrode configurations described in U.S. patent application Ser. No. 15/131,443 may be implemented in the same manner in accordance with the present techniques. For instance, rather than a cylindrical case electrode, a solid electrode(s) can be implemented wherein the diamagnetic rod passes between the electrode(s) and the PDL magnets. See, for example, FIG. 4 of U.S. patent application Ser. No. 15/131,443.

Referring to FIG. 13, oscillations of the trapped diamagnetic object which is also conducting can be affected using an electrode "Drive" unit that applies a positive bias voltage to control & sense electrode 1 and to control & sense electrode 2 in an alternating manner. This applied bias voltage will change the position of the diamagnetic object in the PDL trap. For instance, when a bias voltage $V_1$ is applied to control & sense electrode 1 it will draw the diamagnetic object toward the control & sense electrode 1 and to the left side of the PDL trap. Subsequent removal of the bias voltage $V_1$ from control & sense electrode 1 will cause the diamagnetic rod to restore its position to the equilibrium, i.e., at rest the diamagnetic rod will sit above the center of the PDL trap due to the symmetric camelback potential. Next, alternately applying a bias voltage $V_2$ to the control & sense electrode 2 will have the same effect, only the diamagnetic object will be drawn toward the control & sense electrode 2 and to the right side of the PDL trap. Thus, by applying voltages $V_1$ and $V_2$ to both electrodes consecutively and periodically with a frequency equal to the natural frequency of the camelback potential, the diamagnetic object will be driven into resonant oscillation.

In addition to controlling the movement of the diamagnetic object in the PDL trap, control & sense electrode 1 and control & sense electrode 2 can also be used to detect the position of the rod in the PDL trap using a capacitance meter sensor called a 'Sense' unit. See FIG. 13. Capacitive sensing techniques are also described in U.S. patent application Ser. No. 15/131,443. A 'Relay' is used to switch control & sense electrode 1 and control & sense electrode 2 from "Drive" circuitry to "Sense" circuitry. For instance, in this particular example, toggling the Relay to the left will engage the "Sense" circuitry and toggling the Relay to the right will engage the "Drive" circuitry. Using a differential capacitance meter, the capacitance difference between the two shells of each control & sense electrode pair can be measured. As the diamagnetic object moves in the PDL trap in between the two shells of control & sense electrode 1 or in between the two shells of control & sense electrode 2, the capacitance between the respective shells increases. The capacitance difference is proportional to the displacement of the diamagnetic object. Hence, by measuring the capacitance difference we can measure the displacement of the diamagnetic object. See, for example, U.S. patent application Ser. No. 15/131,443. The diamagnetic object displacement data (i.e., the differential capacitance output signal) is fed to a microcomputer that computes the frequency f and damping time constant τ of the signal which can be used to compute the magnetic susceptibility χ and conductivity σ of the diamagnetic object respectively. See Equation 4-7 above.

According to an exemplary embodiment, an auto oscillator circuit and frequency demodulator is integrated with the present PDL trap-based conductivity measurement system to enhance the accuracy of the frequency and damping determination by enabling the detection of small changes in frequency over time. See, for example, FIG. 14. In this particular example, oscillation of the diamagnetic object is driven using electrodes (and an applied Drive voltage) and the position of the diamagnetic object in the PDL trap is sensed using a light source and differential photodiodes as detailed above. However, in practice, any of the above-described schemes for driving and sensing the position of the diamagnetic object in the PDL trap can be employed in the same manner. As provided above, the diamagnetic object can itself be the material under test, or the material can be coated on or contained within the diamagnetic object (e.g., that is configured as a 'boat' or other vessel in which the material under test is placed).

Figure 14:
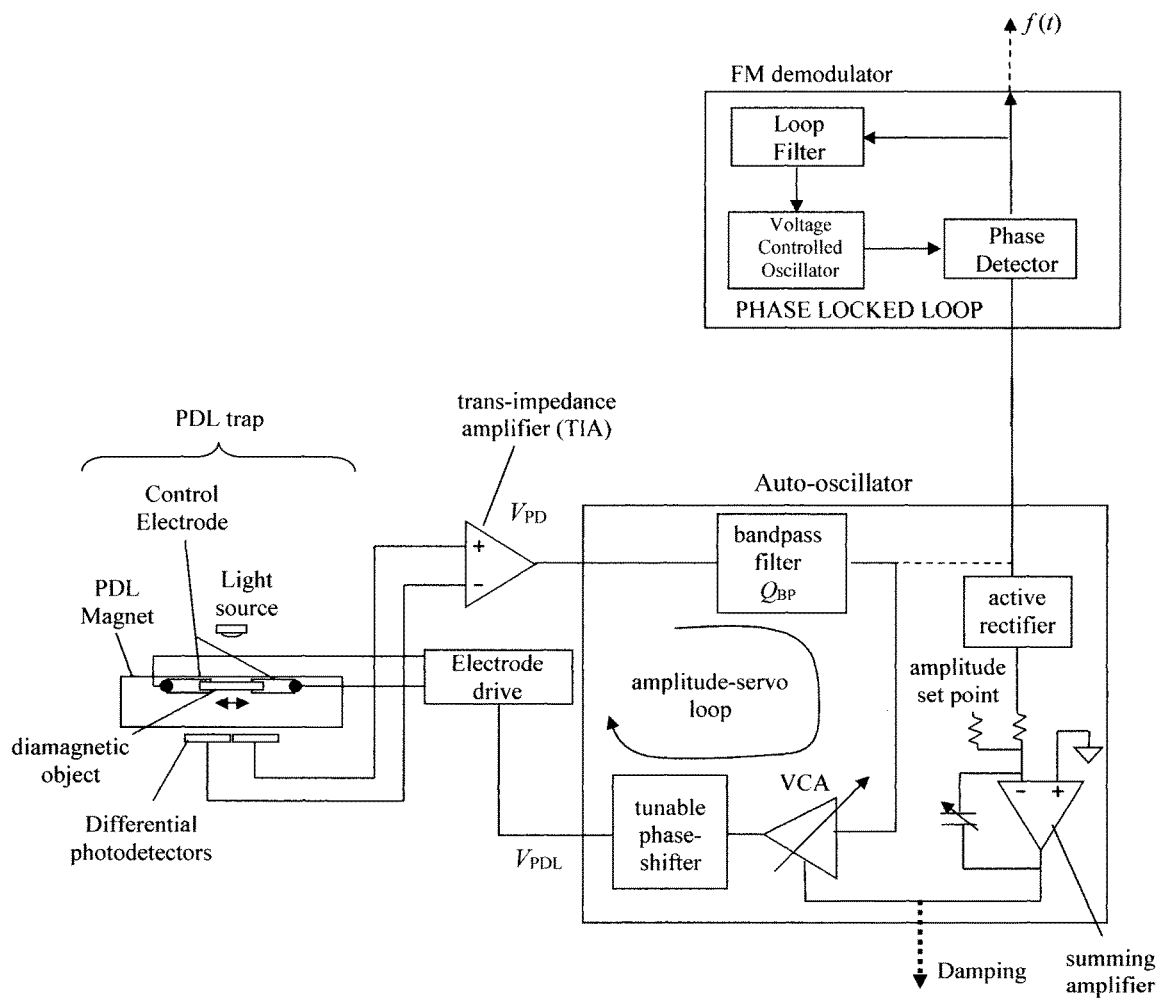
FIG. 14 is a diagram illustrating an auto oscillator circuit and frequency demodulator being used in conjunction with the present PDL trap-based conductivity and magnetic susceptibility measurement system according to an embodiment of the present invention.

In the exemplary embodiment depicted in FIG. 14, detection of the PDL oscillation frequency and damping is realized using a frequency modulation (FM) detection method. In this approach, the PDL system is a frequency limiting element (or filter) in an auto oscillation circuit with the Drive voltage to the PDL ($V_{PDL}$) as the input and the signal (indicating the position of the diamagnetic object in the PDL trap) from the differential photodiode as the output.

As shown in FIG. 14, the output current of the differential photodiodes is amplified by a trans-impedance amplifier (TIA) and then filtered by a bandpass filter ($Q_{BP}$) which might reject higher harmonics of the PDL vibration. The PDL oscillation amplitude, as monitored either by the Drive voltage to the PDL ($V_{PDL}$) or by the photodiode signal ($V_{PD}$), is stabilized by a high-gain, amplitude-servo loop. In order to provide positive feedback, the output of the amplitude servo loop is phase-shifted by a tunable phase-shifter.

The frequency of the PDL auto oscillation is demodulated with an FM demodulator/phase detector for example using a Phase-Locked Loop (PLL) circuit. For this, a replica of the oscillation signal is passed through the tunable bandpass filter and fed to the PLL circuit. This provides the frequency signal f as an analog voltage and as described above can be used to compute the magnetic susceptibility χ of the trapped object.

The oscillation amplitude-servo loop measures $V_{PD}$ or $V_{PDL}$ with an active full-wave rectifier, compares this with a set point in a summing amplifier, and sends the error signal to a voltage-controlled amplifier (VCA) that drives the PDL. The size of this error signal is proportional to the loss rate of the PDL oscillation amplitude and thus directly proportional to the damping. The primary output signal that is monitored from this system is the damping time constant (τ) which, as described above, can be used to compute the conductivity σ of the diamagnetic object. See Equation above.

Figure 15:
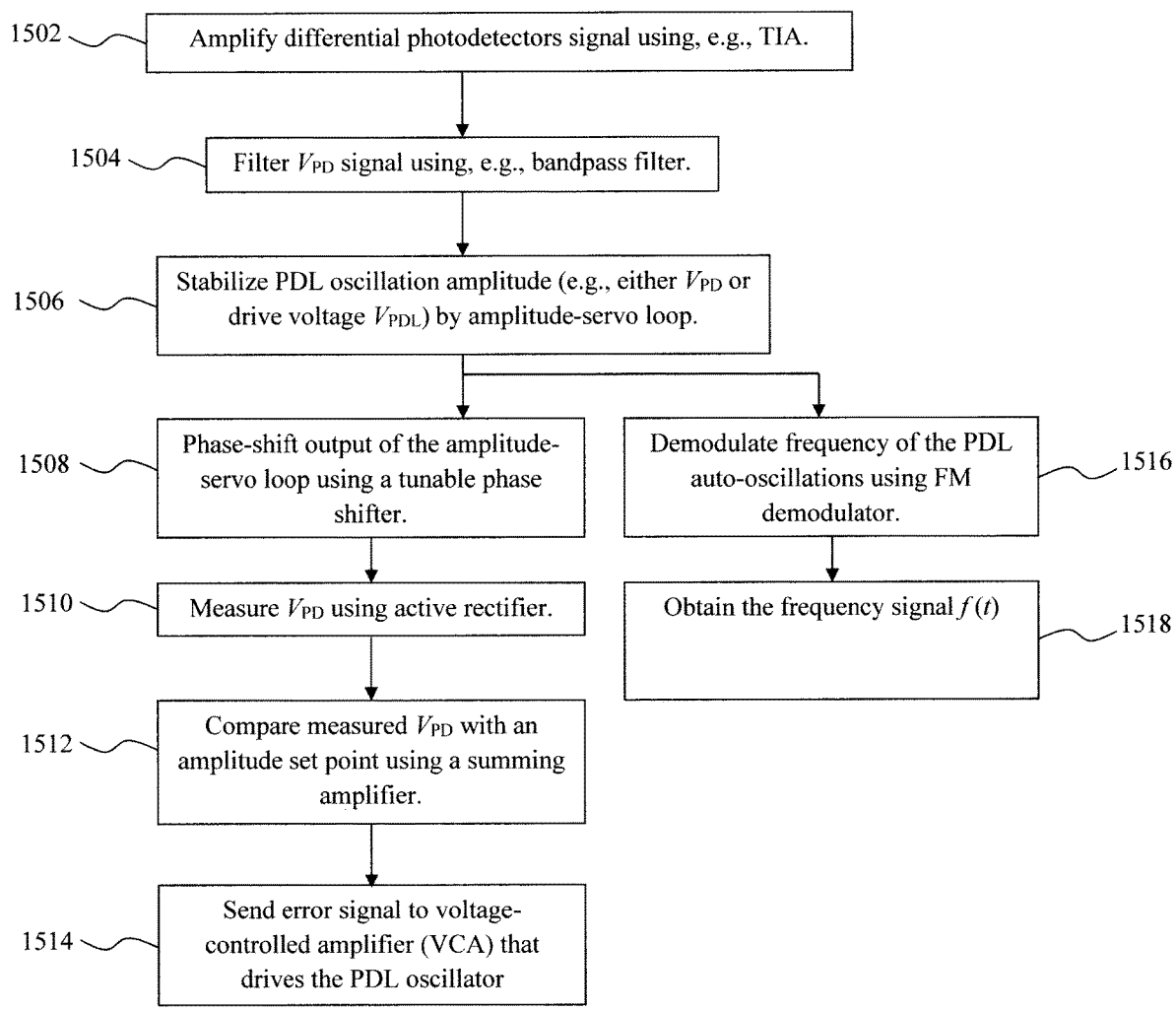
FIG. 15 is an exemplary methodology for operating the present PDL trap-based conductivity and magnetic susceptibility measurement system having an auto-tuning oscillator and frequency demodulator according to an embodiment of the present invention.

An exemplary method for operating the present PDL trap-based conductivity measurement system with an auto oscillator circuit and frequency demodulator is now described by way of reference to methodology 1500 of FIG. 15. In step 1502, the output current from the photodetectors (which changes as the diamagnetic rod passes between the light source and the photodetectors—see above) is amplified by the trans-impedance amplifier (TIA) and, in step 1504, that (output current) signal is filtered by the bandpass filter which might reject higher harmonics of the PDL oscillation.

In step 1506, the PDL oscillation amplitude, as monitored either by the drive voltage ($V_{PDL}$) or the photodetector signal ($V_R$), is stabilized by the high-gain, amplitude-servo (i.e., closed) loop. The output of the amplitude-servo loop is phase-shifted by a tunable phase-shifter in step 1508.

As highlighted above, the oscillation-amplitude-servo loop measures $V_R$ or $V_{PDL}$ with an active full-wave rectifier (step 1510), compares this with an amplitude set point in a summing amplifier (step 1512), and sends the error signal (i.e., the difference between $V_R$ or $V_{PDL}$ and the set point) to the voltage-controlled amplifier (or VCA) that drives the PDL (step 1514). The size of this error signal is the loss of the PDL oscillation amplitude and thus directly proportional to the damping. Thus, knowing the magnitude of the damping, the electrode voltage drive $V_{PDL}$ can be varied to maintain the oscillations of the diamagnetic rod via the above-described electrode "Drive" unit. This Drive unit will translate and amplify the $V_{PDL}$ input signal to both control electrodes. For example, when $V_{PDL}$ is positive the left voltage will be amplified to drive the left electrode and when $V_{PDL}$ is negative the voltage will be inverted and amplified to drive the right electrode. The electrodes only take positive voltage to drive the trapped diamagnetic object. In the steady state, the output electrode voltage bias is applied in such a way that the applied force is in phase with the natural oscillation of the trapped diamagnetic object.

To read the oscillation frequency from the system, in step 1516 the frequency of the PDL auto oscillation is demodulated with an FM demodulator/phase detector for example using the Phase-Locked Loop (or PLL) circuit. For this, a replica of the oscillation signal is passed through the tunable bandpass filter and fed to the PLL circuit. The PLL circuit yields frequency modulation signal f(t) from the phase detector. From this signal one can calculate the frequency and thus the magnetic susceptibility of the trapped object. See step 1518.

Figure 16:
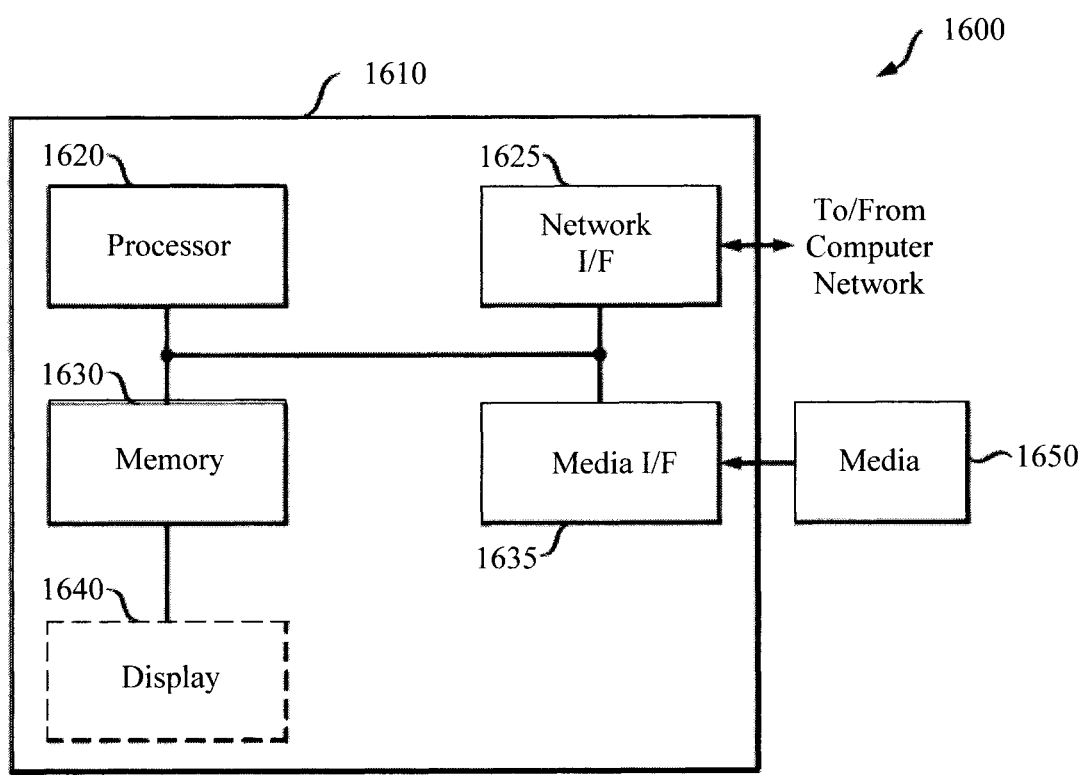
FIG. 16 is a diagram illustrating an exemplary apparatus that can be configured to serve as the microcomputer in the present conductivity and magnetic susceptibility measurement system according to an embodiment of the present invention.

As provided above, a microcomputer can be implemented in the present conductivity and magnetic susceptibility measurement system to receive the diamagnetic object displacement data from the PDL trap and measure the frequency f, damping time constant τ of the signal to compute magnetic susceptibility and the conductivity σ of the diamagnetic object respectively. A block diagram is shown in FIG. 16 of an apparatus 1600 that can be configured to serve as the microcomputer in the present system. Apparatus 1600 includes a computer system 1610 and removable media 1650. Computer system 1610 includes a processor device 1620, a network interface 1625, a memory 1630, a media interface 1635 and an optional display 1640. Network interface 1625 allows computer system 1610 to connect to a network, while media interface 1635 allows computer system 1610 to interact with media, such as a hard drive or removable media 1650.

Processor device 1620 can be configured to implement the methods, steps, and functions disclosed herein. The memory 1630 could be distributed or local and the processor device 1620 could be distributed or singular. The memory 1630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1620. With this definition, information on a network, accessible through network interface 1625, is still within memory 1630 because the processor device 1620 can retrieve the information from the network. It should be noted that each distributed processor that makes up processor device 1620 generally contains its own addressable memory space. It should also be noted that some or all of computer system 1610 can be incorporated into an application-specific or general-use integrated circuit.

Optional display 1640 is any type of display suitable for interacting with a human user of apparatus 1600. Generally, display 1640 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A measurement system, comprising:
    a parallel dipole line (PDL) trap having a pair of dipole line magnets; and
    a diamagnetic object levitating above the dipole line magnets, wherein the diamagnetic object is configured to contain a material under test for conductivity and magnetic susceptibility measurement by the measurement system.

2. The measurement system of claim 1, further comprising:
    a vacuum chamber in which the PDL trap and the diamagnetic object are contained.

3. The measurement system of claim 1, wherein the diamagnetic object comprises a slab of a diamagnetic material.

4. The measurement system of claim 3, wherein the diamagnetic material is the material under test.

5. The measurement system of claim 1, wherein the material under test is attached to the diamagnetic object.

6. The measurement system of claim 5, wherein the material under test is coated on the diamagnetic object.

7. The measurement system of claim 1, wherein the diamagnetic object is configured as a vessel, and wherein the material under test is placed inside the vessel.

8. The measurement system of claim 1, further comprising:
    a digital video camera positioned over the PDL trap configured to capture images of the diamagnetic object trapped in the PDL trap.

9. The measurement system of claim 1, further comprising:
    a light source positioned over the PDL trap; and
    at least one photodetector beneath the PDL trap opposite the light source, wherein the at least one photodetector is configured to detect a position of the diamagnetic rod as the diamagnetic rod passes between the light source and the at least one photodetector.

10. The measurement system of claim 9, further comprising:
    an auto-oscillator connected to the PDL trap, wherein the auto-oscillator comprises a voltage-controlled amplifier in an amplitude-servo loop connected to the at least one electrode and the at least one photodetector.

11. The measurement system of claim 10, further comprising:
    a frequency modulation (FM) demodulator connected to the PDL trap and the auto-oscillator.

12. The measurement system of claim 1, further comprising:
    at least one electrode over the PDL trap, wherein the at least one electrode comprises two semi-circular shells in a non-contact position relative to one another, and wherein the two semi-circular shells partially surround the diamagnetic object such that the diamagnetic object is present between the two semi-circular shells.

13. The measurement system of claim 12, further comprising:
   multiple electrodes above the PDL trap; and
   a capacitance meter sensor connected to the multiple electrodes.

14. A method for analyzing a material under test, the method comprising the steps of:
   providing a measurement system including i) a PDL trap having a pair of dipole line magnets, and ii) a diamagnetic object levitating above the dipole line magnets, wherein the diamagnetic object is configured to contain the material under test;
   displacing the diamagnetic object to initiate oscillations of the diamagnetic object in the PDL trap;
   detecting oscillations of the diamagnetic object in the PDL trap;
   determining a damping time constant $\tau$ from the oscillations of the diamagnetic object in the PDL trap; and
   determining a conductivity of the material under test using the damping time constant $\tau$.

15. The method of claim 14, further comprising the steps of:
   determining a frequency f from the oscillations of the diamagnetic object in the PDL trap; and
   determining a magnetic susceptibility of the material under test using the frequency f.

16. The method of claim 14, wherein the diamagnetic object comprises a slab of a diamagnetic material.

17. The method of claim 14, wherein the diamagnetic material is the material under test.

18. The method of claim 14, further comprising the step of:
   attaching the material under test to the diamagnetic object.

19. The method of claim 17, further comprising the step of:
   coating the material under test on the diamagnetic object.

20. The method of claim 14, wherein the diamagnetic object is configured as a vessel, the method further comprising the step of:
   placing the material under test in the vessel.

* * * * *